United States Patent [19]
Dehmel et al.

[11] 4,417,204
[45] Nov. 22, 1983

[54] PRINTED CIRCUIT BOARD TESTER AND ADAPTER WITH MEMORY

[75] Inventors: Rudiger Dehmel, Laatzen; Martin Maelzer, Wunstorf; Christian Seyb, Wennigsen, all of Fed. Rep. of Germany

[73] Assignee: Luther & Maelzer GmbH, Wunstorf, Fed. Rep. of Germany

[21] Appl. No.: 233,326

[22] Filed: Feb. 11, 1981

[30] Foreign Application Priority Data

Apr. 3, 1980 [DE] Fed. Rep. of Germany ....... 3013215

[51] Int. Cl.³ ............................................. G01R 15/12
[52] U.S. Cl. ............................ 324/73 PC; 324/158 F
[58] Field of Search ............ 324/73 PC, 158 F, 158 P

[56] References Cited

U.S. PATENT DOCUMENTS

| | | | |
|---|---|---|---|
| 2,887,622 | 5/1959 | Rayburn et al. | 324/73 PC |
| 3,654,585 | 4/1972 | Wickersham | 324/158 F |
| 4,099,120 | 7/1978 | Aksu | 324/158 F |
| 4,352,061 | 9/1982 | Matrone | 324/158 F |

OTHER PUBLICATIONS

Luther et al., LP18-2030 PCB Test System Operation/Maintenance Manual, Copyright 1980.

*Primary Examiner*—Gerard R. Strecker
*Assistant Examiner*—Warren S. Edmonds
*Attorney, Agent, or Firm*—Fitzpatrick, Cella, Harper & Scinto

[57] ABSTRACT

A self-programming printed circuit board tester which receives and stores information corresponding to the conductive and insulative relationships between test points or master printed circuit boards and then compares that information to information received from boards to be tested and an adapter for connecting each master printed circuit board to the tester, the adapter having a memory which stores and supplies to the tester information corresponding to information supplied through the adapter to the tester from a perfect master printed circuit board.

8 Claims, 8 Drawing Figures

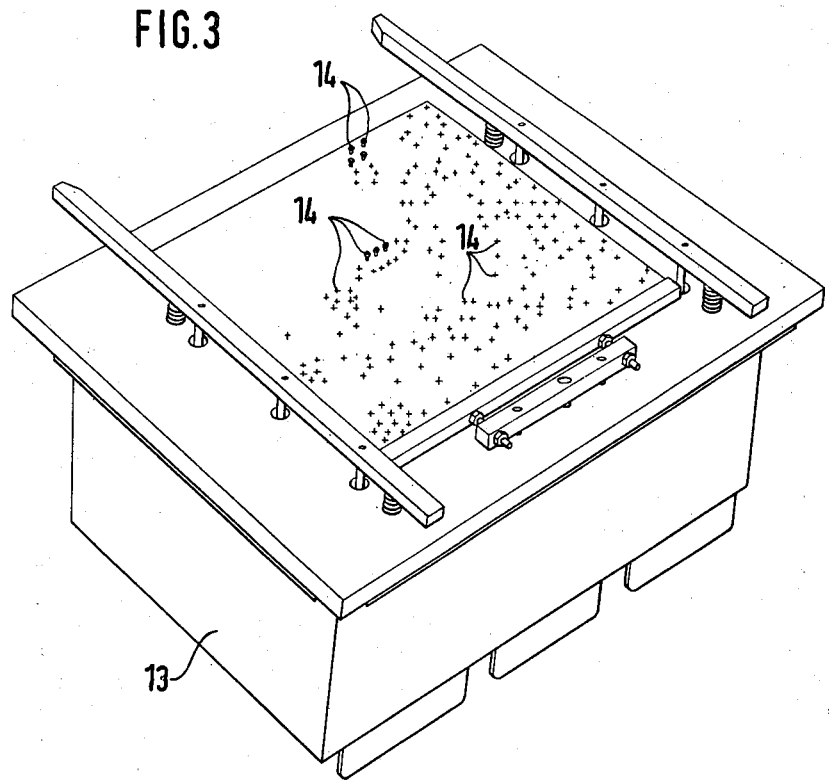

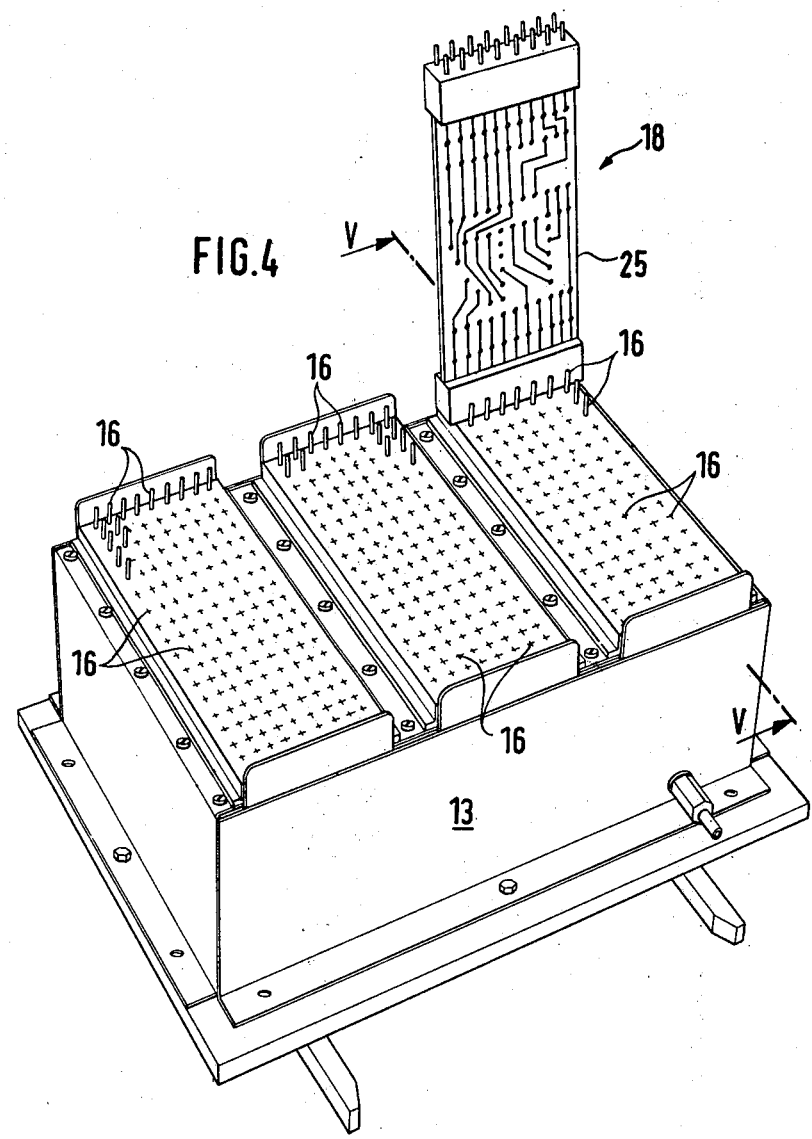

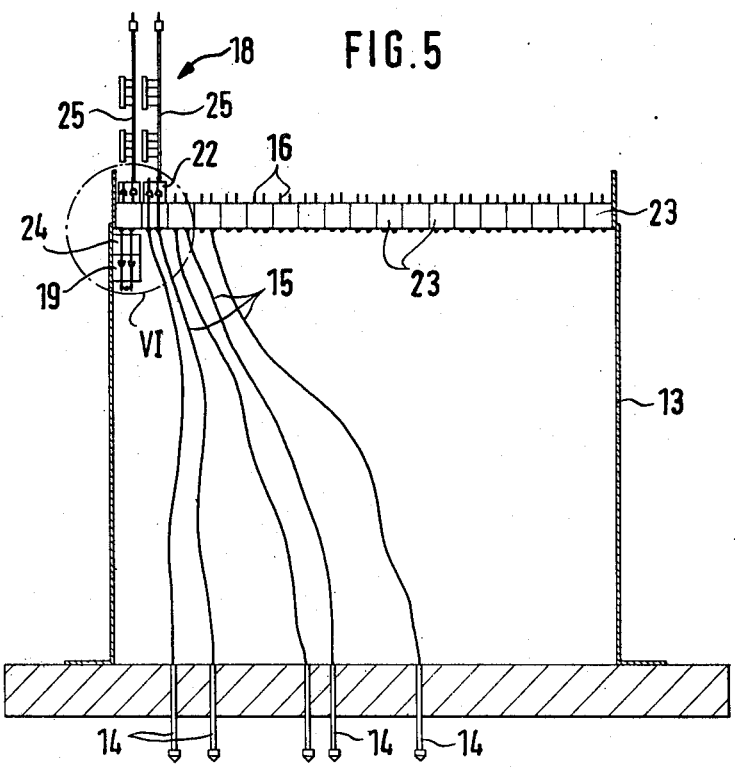
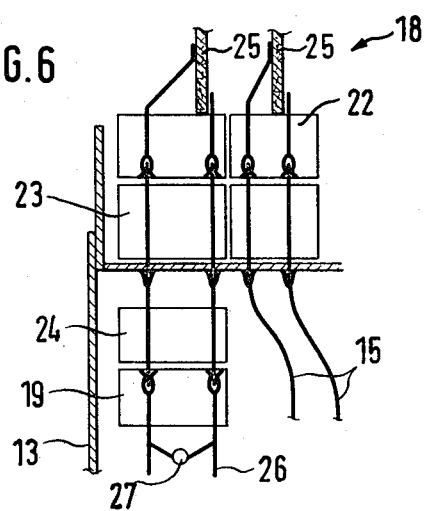

PRINTED CIRCUIT BOARD TESTER AND ADAPTER WITH MEMORY

BACKGROUND OF THE INVENTION

1. Field of the Invention

This invention relates to an adapter for a self-programming printed circuit board tester.

2. Description of the Prior Art

Printed circuit board testers with which unassembled (i.e. prior to component insertion) printed circuit boards are inspected for insulation failures and contact faults between the separate conductor paths are known per se. With these instruments, an adapter is set up on a printed circuit board so that its contact pins are positioned on corresponding test points of the printed circuit board. An example of such an adapter is described in Luther, U.S. Pat. No. 3,996,516. These contact pins are connected with corresponding contacts of a connecting plug to which the tester itself is connected. During testing, the instrument determines with what other test points each individual test point is conductively connected. The results obtained are compared with reference or design results that correspond to results obtained from a faultless printed circuit board. If, for example, an extra contact is found, this indicates an insulation failure. If, on the other hand, the instrument detects a conductive connection less than the reference or design result, this signifies that a contact fault, such as a break in conducting path, exists.

"Automatic programming" printed circuit board testers have recently been developed. In these testers an adapter is set up on a fault-free master printed circuit board. By means of a suitable program the tester undergoes a learning cycle during which it interrogates separate contact pins of the adapter to ascertain whether a conductive connection exists with any other contact pins of the adapter. The results of each interrogation are stored in a memory of the printed circuit board tester and are retrieved for comparison purposes during the actual testing process. Thus, the electronics of the printed circuit board tester learns from the master board which points of such master board are insulated and between which test points conductive connections exist. Use of the tester for testing a given type of printed circuit board therefore begins with the learning of the testing program from a master board.

If the tester is to be used to test another type of printed circuit board which has a different conductor path layout, the electronics of the tester must learn a new testing program from a corresponding new master board on which a corresponding new adapter is set up. In the process, the testing program used for the type of board previously tested is erased and lost.

If later the tester is once again used for testing the first type of printed circuit board, the first testing program must be learned all over again, with the corresponding adapter again being set up on a master board and the learning program again run off. Here the following problems may occur:

If an adapter has for example lain on a shelf for some time and one of its test pins has become defective, for example by breaking off or by oxidizing or if the defect is not detected, when the adapter is set up on a master board considered to be good, the tester electronics will learn a defective program. In addition, the original master board originally used, which likewise had to be stored, may itself have sustained damage. If a new printed circuit board considered good is used as a master instead of the original master board, it may contain an undetected manufacturing defect. It is also possible that the connection of the adapter to the printed circuit board tester may be defective, so that this, too, may lead to a faulty testing program. The use of a faulty program, however, leads to faulty boards being found to be good and fault-free boards being erroneously found to be defective.

SUMMARY OF THE INVENTION

The present invention, in one aspect, provides novel arrangements for automatic programming of printed circuit board testers by which it is possible to detect, on automatic programming, a contact fault in the adapter, a fault in the master board or some other fault during self-programming, which has led to an error in the testing program.

These novel arrangements involve a special adapter having contact pins for electrical contact with test points of printed circuit boards, connecting plugs for electrical connections to a self-programming printed circuit board tester, conductors joining the contact pins to the connecting plugs, and a memory preset with stored information representative of the results of a test of a master printed circuit board, the memory being connected to be interrogated by the tester for comparison with results obtained from subsequent tests of the master printed circuit board.

The entire testing program, which is initially learned from the new faultless master board and the similarly new faultless adapter, can, in principle, be read into the memory of the inventive adapter. Then, if after testing other types of printed circuit boards, the tester is again used for this special type of board, the testing program can be read out of the adapter into the corresponding electronics of the tester and is again available.

A further aspect of the invention, however, involves not storing the entire originally-learned program in the adapter memory, but storing information derived from that program in a memory of substantially smaller scale. In relearning the testing program, this stored derivative information is used to make a comparison which serves to detect whether a contact fault or some other failure in the master board or adapter was present during the relearning process. This further aspect of the invention offers the particular advantage that a very simple and sturdily built memory may be utilized which is cost efficient and insensitive to external influences. If on the other hand, the entire learned program were to be stored in the adapter in the form of a magnetic card, for example, the adapter would have to be shielded from magnetic fields. Storage in the form of a punched strip would likewise possible, but would have the disadvantage that a special reading device would be necessary. In accordance with this further aspect of the invention, these difficulties are avoided.

In particular, it has been found to be advantageous to use a simple plug-in strip as the memory, wherein information storage is in the form of conductive connections established between the individual connecting contacts. This strip may be mounted on one of the connecting plugs of the adapter, so that the information is availble to the printed circuit board tester by way of this connecting plug during the self-programming procedure.

BRIEF DESCRIPTION OF THE DRAWINGS

By way of example of the many features and advantages of the invention, an illustrative embodiment adapter is described below and shown in the accompanying drawings in which:

FIG. 3 is a perspective view of a new adapter used with the tester of FIG. 1, as seen from below;

FIG. 4 is a perspective view of the adapter of FIG. 3 as seen from above;

FIG. 5 is a section view taken along line V—V of FIG. 4;

FIG. 6 is an enlarged view of a segment represented by a phantom line circle VI of FIG. 5;

DETAILED DESCRIPTION OF THE PREFERRED EMBODIMENT

Figure 1:
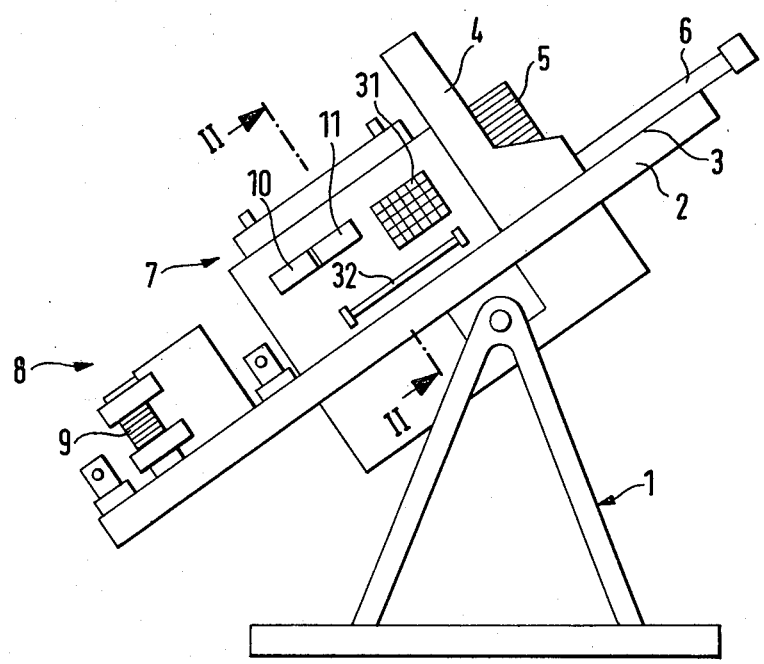
FIG. 1 is a side view, partially in schematic outline, of a known printed circuit board tester.
Figure 2:
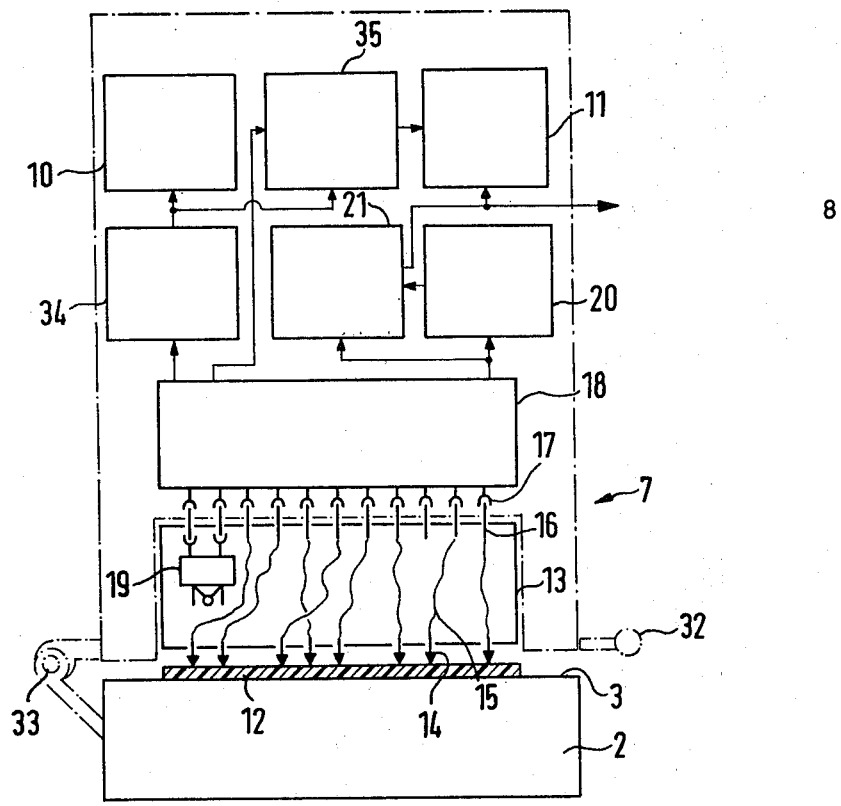
FIG. 2 is a section view, also partially in schematic outline, taken along the line II—II through the tester of FIG. 1.

The printed circuit board tester illustrated in FIGS. 1 and 2 is in the prior art and the example shown is a Luther & Maelzer Model LP 18-2030 PCB Test System which is availble from Luther & Maelzer Inc., 10 Dale Street, Waltham, Mass. 02154. As shown in FIG. 1, the printed circuit board tester is arranged on a mount 1 supporting an inclined table 2. On the upper side 3 of the table, there is located a magazine 4 for holding printed circuit boards 5 to be tested. The printed circuit boards 5 are ejected in cycles from the bottom of the magazine 4 by means of a slide (not shown). A pneumatic cylinder 6 serves to operate the slide. The printed circuit boards 5 are brought to a testing position beneath a testing assembly 7 which is adjacent the magazine 4. The testing assembly 7 includes electronic circuits for first learning a testing program and thereafter performing tests on the boards 5. The testing assembly 7 has a display window 10 for displaying information representative of the testing program and a display window 11 for displaying errors detected in the tested boards. In addition, the testing assembly 7 is provided with a keyboard 31 for entering in individual operating functions.

By means of a handle 32 (FIGS. 1 and 2), the testing assembly 7 is pivotable upwardly about a pivot axis 33 (see FIG. 2) which is parallel to the inclined plane of the table 3.

After testing, each printed circuit board slides, by force of gravity, along the inclined plane of the table 3 into a sorting device 8 shown in FIG. 1. The control of the sorting device 8 is responsive to the testing results obtained by the testing assembly 7 to sort the printed circuit boards into stacks: those having undesired conductor path connections, those having undesired conductor path breaks and those which are good. A stack of printed circuit boards which have been tested and found to be good is designated by the numeral 9 in FIG. 1.

The sorting device is the subject matter of commonly owned U.S. patent application Ser. No. 970,248, filed Dec. 18, 1978, now U.S. Pat. No. 4,245,940. The slide with the magazine is the subject matter of commonly owned U.S. patent application Ser. No. 970,484, filed Dec. 18, 1978, now U.S. Pat. No. 4,273,321.

In FIG. 2 a printed circuit board as positioned for testing on the upper side 3 of the table 2 in the area of the testing assembly 7, is represented by the reference numeral 12. An adapter 13 serves as an interface between electronic test circuits and test points located on the printed circuit boards. The testing assembly (represented by dot-and-dash lines) contains electronic interrogation circuits 18 to electronically interrogate the separate test points of the printed circuit board 12 in order to determine whether or not an electrical connection exists between any two given test points. The electrical connections detected between test points on the tested board are electronically compared with stored reference results obtained from a previous interrogation of the test points of a "faultless" master printed circuit board. A tested board is "good" if the test results match the stored reference results. If the test results indicate more electrical connections than the reference results, undesired conductor path connections exist; and if the test results indicate fewer electrical connections than the reference results, undesired conductor path breaks exist.

As may be seen from FIGS. 4 and 5, the electronic interrogation circuits 18 (FIG. 2) comprises a plurality of plug-in printed circuit cards 25 (sometimes called "switch cards") having electronic components and printed conducting connections. The plug-in cards 25 are provided with plug-in strips having contact receptacles 17 (FIG. 2) at an outside edge. Electrical connection is established between the tester electronics and the adapter 13 by means of connecting plugs 16 on the adapter 13 which are inserted into the contact receptacles 17.

Each type of printed circuit board 12 to be tested has an associated matching adapter 13. The underside of each adapter 13 has point contact pins 14 (FIG. 5) which are matched to the type of board being tested so that they press onto selected test points of the printed circuit board 12. The contact pins 14 are connected to the connecting plugs 16 via conductors, such as conducting wires 15, located within the adapter 13. To ensure reliable electrical contact between the contact pins 14 and the test points of the board to be tested, at the time when the printed circuit board 12 is brought to the testing position, the board is subjected to ultrasonic vibrations as described in Luther U.S. Pat. No. 3,996,516. The adapter 13 also includes a preset memory 19, which is described in more detail below.

The conductor path layout (and thus the positioning of the test points) is different for different types of printed circuit boards. Therefore, if a different type of printed circuit board is to be tested, the adapter 13 must be correspondingly exchanged. This can be done in a simple manner by tilting the testing assembly 7 about the pivot axis 33 (FIG. 2) and then withdrawing the adapter 13 from the recess within which it is received and replacing it with another adapter 13 which has been produced for the different type of circuit board. Likewise, each time a different type of circuit board is to be tested, the tester must be programmed with the "ideal" reference results obtained from an interrogation of a "faultless" master board of the different type.

Whenever the tester to be used for the first time to test a "new" type of printed circuit board, the new testing program must be learned. This is accomplished by placing the tester in the self-programming mode and electrically interrogating a freshly produced master board using an equally fresh adapter 13. For this purpose the adapter is mounted with its contact pins 14 on the master board.

FIG. 3 shows a view of the adapter from below with the points of the contact pins which are to be pressed against the test points of the conducting paths of the master printed circuit board shown schematically by crosses "x". The conducting wires 15 joining the connecting plugs 16 of the connecting blocks 23 to the pointed contact pins 14 are shown in FIG. 5. FIG. 6 shows an enlarged view of part of FIG. 5 which more clearly shows the contact strips 22 of the test point cards 25 which are mounted on the connecting plugs 16 of the connecting blocks 23. The adapter 13 is electrically connected to the electronic interrogation circuits 18 at connecting plugs 16 (FIG. 5) and the master board 12 is brought into the testing position on the tester (See FIG. 2) and is electrically interrogated to determine its test point interconnections as described below. A first one of the contact pins 14 is energized by the electric interrogation circuits 18 and the circuits 18 check to see what electrical contact is made with other contact pins 14 through the printed circuit board connector paths. When this is established, a next one of the contact pins 14 is energized and a corresponding interrogation is performed. This process is repeated for all of the contact pins 14 of the adapter 13. The interrogation results are stored in a tester memory 20 in the form of a table which indicates with what other test points each individual test point of the printed circuit board is connected. The table may, for example, be in matrix form with the energized test points listed as column headings and the respective conductively connected test points being indicated by entries in corresponding rows beneath them.

When this table of "ideal" interrogation results has been completed, the learning process is terminated. The results of the testing undertaken by the interrogation of a master board are thus stored in the tester memory 20 (FIG. 2) which now contains the reference data as to which test points of a "faultless" printed circuit board are electrically interconnected and which are electronically insulated.

When the tester has been programmed in the manner described, the tester is ready to test the conductor paths of other (i.e. production line) printed circuit boards of the same type. The electronic interrogation circuits of the tester will compare each set of interrogation test results with the stored results obtained from the initial interrogation of the master printed circuit board. The electrical comparison is done by means of a comparator 21 (FIG. 2). The results of the comparison by comparator 21 are displayed on the display panel 11 (FIGS. 1 and 2) which reads either "good", "insulation fault" or "break fault". For insulation faults and break faults, the locations of the faults (i.e. between which test points) are displayed. In addition, the results of the comparison made by comparator 21 are communicated to the control circuit of the sorting member 8, which sorts the printed circuit boards as they leave the testing assembly 7, as already described.

When another type of printed circuit board is to be tested, the former contents of the memory 20 are erased and the learning is performed anew with entry of new reference test results into memory 20 in the same manner, as described above.

A different master board 12 and corresponding different adapter 13 are produced for each type of printed circuit board to be tested. When a particular type of board is being tested for the first time, the master board and corresponding adapter are freshly produced. Thus, one may be fairly sure that they are indeed "faultless." However, when tests on a type of board have been previously done and the master board and the adapter are "old", having been stored for a prolonged period while other types of printed circuit boards have been tested by the tester, such assurance does not exist. During the time of storage, faults may have arisen through mechanical damage to the adapter contact pins 14, through scratch damage to the master board's conductor paths, etc. Thus, if such a damaged master board or adapter is used to generate reference interrogation results for testing, the testing assembly 7 will learn a false testing program. This may result in faulty printed circuit boards being found to be good and faultless printed circuit boards being erroneously found to be faulty.

To provide a check as to whether a master board or its corresponding adapter for a given type of printed circuit board has suffered any damage during non-usage and storage between tests the adapter 13 of the present invention is provided for subsequent use with a memory 19 that is preset with stored information representative of the original test of the freshly produced master plate. This stored information serves to verify the continuing accuracy of the testing program each time it is relearned. When a new master printed circuit board and a new adapter are put into operation for the first time, information representative of the reference results obtained by the first interrogation of the master board by the electronic interrogation circuits 18 is derived from those results by a verification data forming circuit 34 (FIG. 2). This information is also displayed on a verification data display 10.

The perspective view of the adapter 13 in FIGS. 3 and 4 shows the pointed contact pins 14 at the bottom and the connecting plugs 16 at the top. FIG. 4 shows only one plug-in card 25 of the electronic interrogation circuits 18. FIG. 5 shows two plug-in cards 25. The plug-in cards 25 are provided at their underside with plug-in strips 22, the connecting plugs 16 of the adapter 13 being inserted in the contact receptacles of those strips. The connecting plugs 16, in turn, belong to plug-in strips 23 which are arranged side by side on the upper side of the adapter 13 (FIGS. 5 and 6). At the bottom of plug-in strips 23 there are located contact points which are connected to the contact pins 14 via conducting wires 15. A further plug-in strip 24, whose contact pins project downwardly, is soldered to the contact points of the lefthand plug-in strip 23 in FIGS. 5 and 6. The verification data memory 19, which is likewise in the form of a plug-in strip, is mounted on the contact pins of strip 23. This is shown in two views in FIGS. 7 and 8.

The verification data can, for instance, be a single representative number characteristic of the table reference test point interconnections stored in the memory 20 during the original learning process from the fresh master board and adapter. This number is stored in the adapter memory 19, which is preferably a fixed-value memory, as described further below in reference to FIGS. 7 and 8. When the tester is subsequently again programmed from the same master and adapter after a period of using the tester for testing other types of boards, the information in the adapter memory 19 provides a simple check on the accuracy of the relearned testing program and on whether the master board or adapter has suffered a contact fault or some other failure, during the interim storage period.

Once the initial test of the fresh master board and adapter is complete and verification data is stored in the memory 19, then for all subsequent tests the interrogation electronics 18 will query the data stored in the adapter memory 19. The queried verification data will be compared with the representative value formed during each subsequent interrogation of the master printed circuit board during the self-programming procedure by the verification data forming circuit 34 in a verification data comparator 35. If the comparator 35 determines coincidence, this indicates that the master printed circuit board and the adapter 13 have not undergone any change during interim storage. If, on the other hand, a discrepancy is detected, then there is an indication that either the master printed circuit board or the adapter 13 have meanwhile sustained damage. The fact of discrepancy will be indicated on the fault display 11 (FIG. 1).

The electronic circuits required for interrogating the contents of the memory 19 and the electronic circuits of the comparator 35 are the same as the electronic circuits conventionally used to interrogate the contact pins 14 and used for comparator 21. The structure of the verification data forming circuit 34 is dependent on the verification number selected for use in the adapter memory 19. The circuit 34 may comprise, for example, a conventional data processor programmed to manipulate the test results stored in the tester memory 20.

After understanding the teachings of this invention as will become apparent from this disclosure, those skilled in the art will appreciate the manner different types of verification data that can be selected for use in practicing the invention and selection will be a matter of personal preference.

A second example of suitable verification number is derived by multiplying the number of interconnected test points in the reference table by the number of insulated test points for any particular single energized point. A characteristic verification number is obtained by adding the code numbers of all the test points together to form an initial sum. Then the code numbers of all the test points appearing in the first column of the table are multiplied by a constant number and thereafter the individual products are added together to obtain a second sum. The first and second sums are added together to form a third sum. This third sum is a characteristic of the particular contents of the table and will produce a different number for different master boards and adapters corresponding to different type of printed circuit board to be tested.

It will be appreciated by those skilled in the art that verification data may be derived in many other ways. What is decisive, however, is that the representative value by characteristic of the interrogation results determined by the interrogation electronics 18 using a "faultless" adapter 13 in a test of a "faultless" master printed circuit board.

The representative value derived by the verification data forming circuit 34 and visually displayed on the verification data display 10 (FIGS. 1 and 2) may be represented in digital form and stored as testing program verification information in adapter memory 19. The memory 19 is located inside the adapter 13, as shown in FIGS. 5 and 6. Between the memory 19 and the connecting blocks 23 there is further found an intermediate block 24 which facilitates attachment and replacement of the memory 19.

The adapter memory 19 is especially valuable when the tester is again used to test a certain type of printed circuit board after a lengthy intervening period of use for testing other types of boards. To prepare for again testing the first type of board, the tester must relearn from the master board the table of reference results concerning interconnection of the test points. In this relearning process the verification data will be formed in the same way from the relearned table as it was in the original programming process. The derived verification number is then compared with the characteristic number fixed in the adapter memory 19 derived previously from the fresh master and fresh adapter. If the two characteristic numbers differ, this means that a fault (as, for example, a contact fault between an adapter pin 14 and the printed circuit board) has occurred in the second learning process. Thus, the self-programming can be monitored for accuracy and for the continued integrity of the master board and the adapter.

If a particular type of printed circuit board has a great many separate test points, the characteristic number could reach a relatively high value and thus the capacity of the adapter memory 19 would have to be more complex. This complexity can be avoided by reducing the value of the verification number while still maintaining enough information to reliably ascertain whether there has been a fault in the second learning process. The verification data could for example, be reduced by dividing it by a constant whole number and sorting only the remainder left over after the division as the characteristic number in the adapter memory. The verification data number obtained in this manner has only low storage location requirements, and can be represented in digital form, for example, in only sixteen bits.

Figure 7:
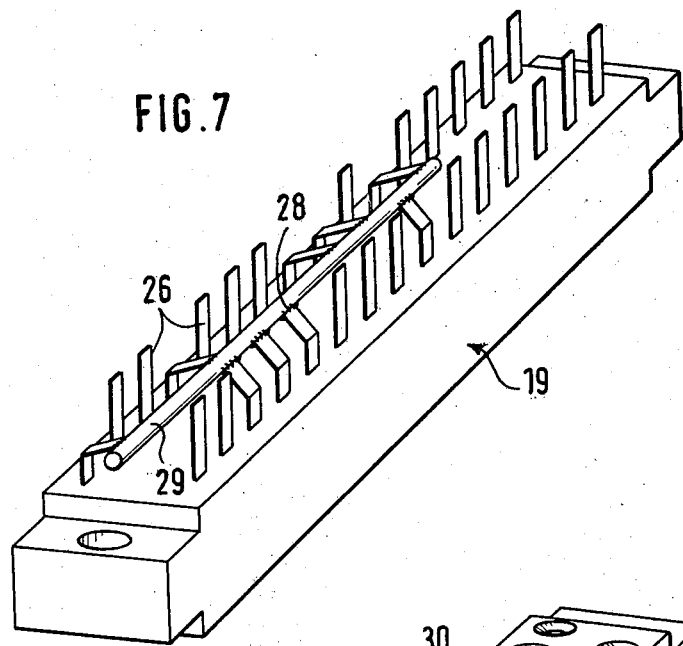
FIG. 7 is a perspective view of a preferred adapter memory used with the tester of FIG. 1, as seen from below.
Figure 8:
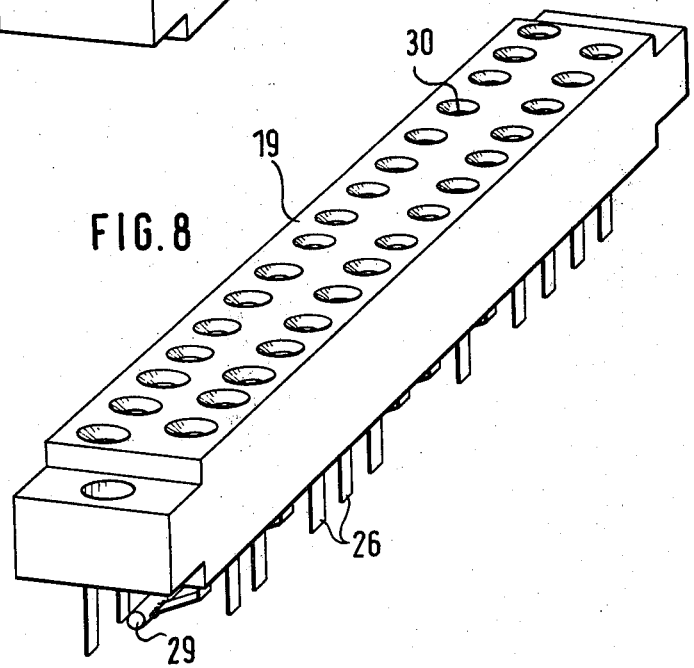
FIG. 8 of a perspective view of the adapter memory of FIG. 7 as seen from above.

A simple example for present adapter memory 19 is shown in FIGS. 7 and 8. The preferred adapter memory 19 consists of a plug-in strip. The stored verification data information is represented in the form of conducting connections between the individual plug contacts 30. These conducting connections are produced in simple fashion by means of a common electrically conducting wire 29 by soldering the corresponding soldering lugs 26 of the plug contacts 30 to this wire at soldering points 28. The soldering lugs may be considered as binary value carriers. A conducting connection made by soldering a lug 26 to the conduction wire 29 will result in a binary "1" being read from the corresponding plug contact 30. The absence of such a connection results in the reading of a binary "0" from the corresponding plug contact 30. This very simple memory construction in the form of a plug-in strip permits rapid examination, even visually, of the adapter memory to see whether the stored information has been altered during storage by some external influence, such as the breakage of a soldering point 12. The totality of soldering lugs (soldered and unsoldered) results in a binary number corresponding to the representative value. Thus, it is evident that such structure for memory 19 is a particularly inexpensive structural element which can be easily programmed.

This plug-in strip may be attached in simple fashion to the intermediate plug 24 (See FIGS. 5 and 6) so that it may be interrogated in the same manner as any other block 23 by the testing electronics 18.

As the verification data memory 19 contains only a representative value and not the complete results of the first interrogation of the master printed circuit board with the corresponding adapter 13, there is a possibility that faults, which arise on the master board and in the adapter, will cancel each other in such a way that on relearning the new verification data will have the same value as the original data, so that the faults in the testing program will go undetected. If desired, the probability of such complementary faults occurring can be reduced by storing more than one representative value in adapter memory 19.

From the foregoing it will be appreciated that with the adapter including a memory preset with stored information representative of the results of the original interrogation of a master printed circuit board, as described herein, self-programming of a printed circuit board tester can be achieved with verification of the continuing integrity of the master board and adapter associated with each type of printed circuit to be tested.

We claim:

1. An adapter for use with a self-programming printed circuit board tester for scanning test points on printed circuit boards, said adapter comprising adapter contact pins for contacting test points on master printed circuit boards and printed circuit boards to be tested; an adapter connecting plug having connecting plug contacts conductively connected to said contact pins, the adapter connecting plug being constructed to be connected to interrogation connections of interrogation circuits contained in the printed circuit board tester, said interrogation circuits being capable of interrogating the test points of the printed circuit boards, storing the interrogation results and making available the interrogation results to a comparator arrangement so as to permit comparison of the interrogation results obtained from interrogation of a master printed circuit board with interrogation results obtained from interrogation of a printed circuit board to be tested; and a memory preset with stored information representative of the results of a test of a master printed circuit board, said memory having read connections connected to selected contacts of the adapter connecting plug for connecting said memory to special interrogation connections of the interrogation circuits of the printed circuit board tester and permitting the information contained in the memory to be interrogated and compared to information previously obtained from a master printed circuit board.

2. An adapter according to claim 1 wherein the storage capacity of said memory is less than the amount required to test all of the test points of said master printed circuit board.

3. An adapter according to claim 1 wherein said memory has a fixed value.

4. An adapter according to claim 3 wherein the memory is a plug-in strip capable of being plugged in to said connecting plugs and wherein said strip stores information in the form of conducting connections between individual conducting contacts.

5. In combination, a self-programming printed circuit board tester which receives and stores test point connection information from a master printed circuit board and compares this information with information subsequently received from a printed circuit board being tested and an adapter connected with the printed circuit board tester and arranged to connect the printed circuit board tester with a master printed circuit board and with a printed circuit board to be tested; said adapter having an adapter plug with special contacts and said adapter having a memory which contains information representative of said test point connection information, said memory being connected to said special ones of said contacts, said printed circuit board tester including interrogation circuits connected to said contacts for interrogating printed circuit boards and for interrogating the memory for the information stored therein, said printed circuit board tester further including a comparator arranged to compare the interrogated information obtained from said printed circuit boards with the interrogated information obtained from said memory.

6. An adapter according to claim 5 wherein the storage capacity of said memory is less than the amount required to test all of the test points of said master printed circuit board.

7. An adapter according to claim 5 wherein the memory is a plug-in strip capable of being plugged in to said connection plugs and wherein said strip stores information in the form of conducting connections between individual conducting contacts.

8. An adapter according to claim 5 wherein said memory has a fixed value.

* * * * *